United States Patent
Jaeger et al.

(10) Patent No.: US 11,038,127 B2
(45) Date of Patent: Jun. 15, 2021

(54) OPTOELECTRONIC COMPONENT, ORGANIC FUNCTIONAL LAYER, AND METHOD FOR PRODUCING AN OPTOELECTRONIC COMPONENT

(71) Applicant: OSRAM OLED GmbH, Regensburg (DE)

(72) Inventors: Arndt Jaeger, Regensburg (DE); Günter Schmid, Hemhofen (DE)

(73) Assignee: OSRAM OLED GMBH, Regensburg (DE)

( * ) Notice: Subject to any disclaimer, the term of this patent is extended or adjusted under 35 U.S.C. 154(b) by 737 days.

(21) Appl. No.: 14/895,486

(22) PCT Filed: Jun. 25, 2014

(86) PCT No.: PCT/EP2014/063410
§ 371 (c)(1),
(2) Date: Dec. 2, 2015

(87) PCT Pub. No.: WO2015/000763
PCT Pub. Date: Jan. 8, 2015

(65) Prior Publication Data
US 2016/0111662 A1    Apr. 21, 2016

(30) Foreign Application Priority Data
Jul. 2, 2013    (DE) ............... 10 2013 106 949.5

(51) Int. Cl.
| | | |
|---|---|---|
| *H01L 51/50* | (2006.01) | |
| *H01L 51/00* | (2006.01) | |
| H01L 51/56 | (2006.01) | |

(52) U.S. Cl.
CPC ........ *H01L 51/0091* (2013.01); *H01L 51/006* (2013.01); *H01L 51/009* (2013.01); *H01L 51/0051* (2013.01); *H01L 51/0072* (2013.01); H01L 51/001 (2013.01); H01L 51/0058 (2013.01); H01L 51/506 (2013.01); H01L 51/5056 (2013.01); H01L 51/5088 (2013.01); H01L 51/5096 (2013.01); H01L 51/56 (2013.01)

(58) Field of Classification Search
CPC ............... H01L 51/0091; H01L 51/006; H01L 51/0072; H01L 51/0058; H01L 51/009; H01L 51/0051; H01L 51/56; H01L 51/5056; H01L 51/506; H01L 51/5088; H01L 51/5096; C07F 1/08
USPC ............... 428/690, 691, 917; 427/58, 66; 313/500–512; 257/40, 88–104, 257/E51.001–E51.052; 252/301, 252/16–301.35
See application file for complete search history.

(56) References Cited

U.S. PATENT DOCUMENTS

| | | | |
|---|---|---|---|
| 8,513,702 B2 | 8/2013 | Schmid et al. | |
| 8,679,646 B2 | 3/2014 | Wada et al. | |
| 8,941,096 B2 | 1/2015 | Tsutsui et al. | |
| 9,006,716 B2 | 4/2015 | Hartmann et al. | |
| 9,166,178 B2 | 10/2015 | Schmid et al. | |
| 2002/0121860 A1* | 9/2002 | Seo ..................... | H01L 51/5012 313/506 |
| 2005/0106419 A1 | 5/2005 | Endoh et al. | |
| 2006/0040132 A1* | 2/2006 | Liao .................... | H01L 51/5036 428/690 |
| 2011/0089408 A1 | 4/2011 | Schmid et al. | |
| 2011/0215304 A1 | 9/2011 | Wada et al. | |
| 2012/0193619 A1 | 8/2012 | Taka et al. | |
| 2012/0286253 A1 | 11/2012 | Schmid et al. | |
| 2014/0034934 A1 | 2/2014 | Kellermann et al. | |
| 2014/0048785 A1 | 2/2014 | Heuser et al. | |
| 2014/0107364 A1 | 4/2014 | Schmid et al. | |
| 2014/0142259 A1 | 5/2014 | Volz et al. | |
| 2014/0264313 A1* | 9/2014 | Schmid ............... | H01L 51/0091 257/40 |
| 2014/0291642 A1* | 10/2014 | Watabe ................ | C09K 11/025 257/40 |
| 2015/0123047 A1 | 5/2015 | Maltenberger et al. | |
| 2015/0162534 A1 | 6/2015 | Maltenberger et al. | |
| 2015/0249230 A1 | 9/2015 | Kido | |
| 2016/0218309 A1 | 7/2016 | Tsutsui et al. | |

FOREIGN PATENT DOCUMENTS

| | | |
|---|---|---|
| CN | 1738502 A | 2/2006 |
| CN | 102195005 A | 9/2011 |
| CN | 102576802 A | 7/2012 |
| DE | 102007028237 A1 | 12/2008 |

(Continued)

OTHER PUBLICATIONS

Bruder, I., et al., "A novel p-dopant with low diffusion tendency and its application to organic light-emitting diodes," Organic Electronics, vol. 11, Jan. 4, 2010, pp. 589-593.
Sevryugina, Y., et al., "The First Hexanuclear Copper(I) Carboxylate: X-ray Crystal Structure and Reactivity in Solution and Gas-Phase Reactions," Inorganic Chemistry, vol. 46, No. 19, Aug. 15, 2007, pp. 7870-7879.
Prajapati, J.H. et al., "Infrared Spectra of Charge Transfer Complexes of bis (N-H-salicylaldiminato) Cu II," Journal of the Indian Chemical Society, Indian Chemical Society, vol. 84, Aug. 2007, 6 pages.
Robles-Martinez, J.G. et al., "Charge Transfer in Organic Electron Conductors with Coordination Complexes Determined by Infrared Absorption Spectroscopy," Inorganica Chimica Acta, 1991, 2 pages.

*Primary Examiner* — Dylan C Kershner
(74) *Attorney, Agent, or Firm* — Slater Matsil, LLP

(57) ABSTRACT

An optoelectronic component includes a substrate, a first electrode, a second electrode, and at least one organic functional layer, which is arranged between the first electrode and the second electrode. The organic functional layer includes a matrix material, a first compound, and a second compound. The first compound interacts with the second compound, and the first compound and/or the second compound interacts with the matrix material. A conductivity of the organic functional layer is produced by the interactions.

14 Claims, 4 Drawing Sheets

(56) References Cited

FOREIGN PATENT DOCUMENTS

| | | |
|---|---|---|
| DE | 102007028238 A1 | 12/2008 |
| DE | 102009047880 A1 | 3/2011 |
| DE | 102010013495 A1 | 10/2011 |
| DE | 102011003192 A1 | 7/2012 |
| DE | 102011007052 A1 | 10/2012 |
| DE | 102011084639 A1 | 4/2013 |
| DE | 102012209520 A1 | 12/2013 |
| DE | 102012209523 A1 | 12/2013 |
| EP | 1318553 A2 | 6/2003 |
| EP | 2543671 A1 | 1/2013 |
| JP | 2003272860 A | 9/2003 |
| JP | 2005166641 A | 6/2005 |
| JP | 2011187656 A | 9/2011 |
| JP | 2012059904 A | 3/2012 |
| JP | 2013505565 A | 2/2013 |
| WO | 2011033023 A1 | 3/2011 |
| WO | 2011120709 A1 | 10/2011 |
| WO | 2013057130 A1 | 4/2013 |
| WO | WO-2013057130 A1 * | 4/2013 ........... H01L 51/506 |
| WO | 2013182389 A2 | 12/2013 |
| WO | WO-2013182383 A1 * | 12/2013 ........... H01L 51/009 |

* cited by examiner

OPTOELECTRONIC COMPONENT, ORGANIC FUNCTIONAL LAYER, AND METHOD FOR PRODUCING AN OPTOELECTRONIC COMPONENT

This patent application is a national phase filing under section 371 of PCT/EP2014/063410, filed Jun. 25, 2014, which claims the priority of German patent application 10 2013 106 949.5, filed Jul. 2, 2013, each of which is incorporated herein by reference in its entirety.

TECHNICAL FIELD

The present invention relates to an optoelectronic component, to an organic functional layer, and to a method for producing an optoelectronic component.

SUMMARY

A problem frequently affecting components which emit radiation, such as organic light-emitting diodes (OLEDs), for example, is that of providing one or more layers having a high conductivity of electrons and/or holes. A higher conductivity in the layers, such as in hole transport or electron transport layers, for example, often positively influences the exciton density in a layer which emits radiation. In the event of inadequate conductivity in the layers, in contrast, increased efficiency losses and luminance losses in components that emit radiation may be the consequence.

Embodiments of the invention specify an optoelectronic component, an organic functional layer which can be used therein, for example, and also a method for producing an optoelectronic component, exhibiting improved conductivity.

BRIEF DESCRIPTION OF THE DRAWINGS

For a more complete understanding of the present invention, and the advantages thereof, reference is now made to the following descriptions taken in conjunction with the accompanying drawings, in which.

Figure 1:
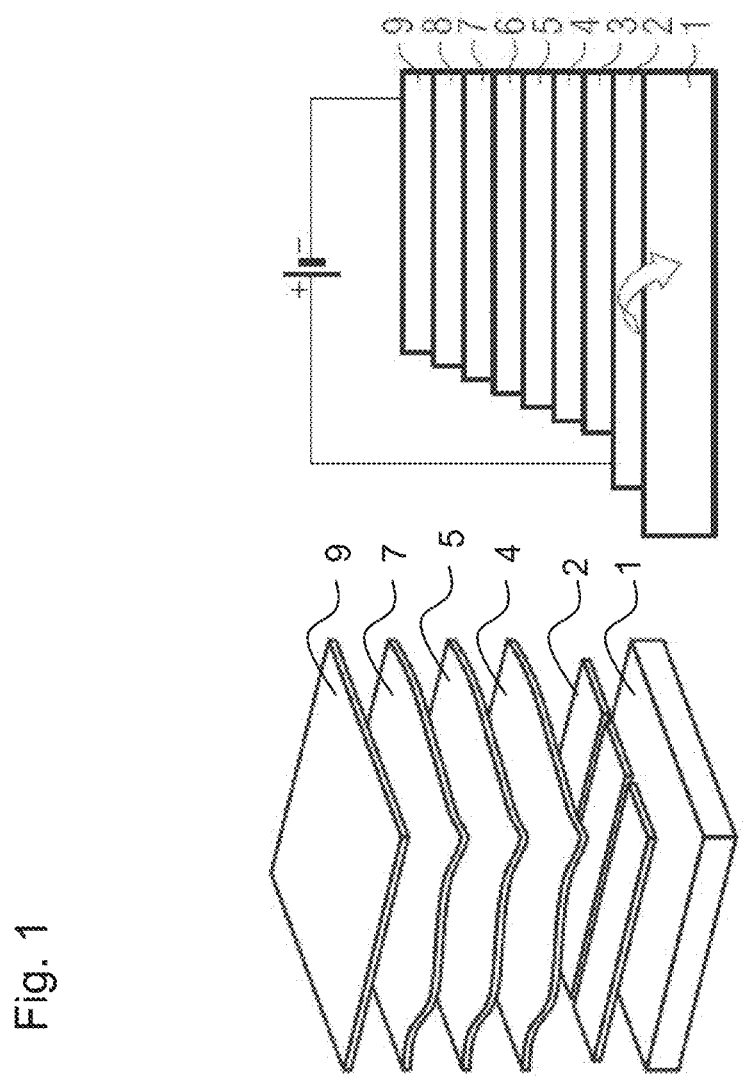
FIG. 1 shows the schematic side view of an optoelectronic component.

In the working examples and figures, constituents which are identical or of identical effect are each provided with the same reference symbols. The elements shown and their size relationships with one another should be considered in principle not to be true to scale. Moreover, identical working examples of first and second compounds and matrix material are given the same abbreviated designations.

DETAILED DESCRIPTION OF ILLUSTRATIVE EMBODIMENTS

In the text below, advantages and advantageous embodiments and development of the subject matter of the invention will be in more detail using figures and working examples.

An optoelectronic component according to one embodiment comprises a substrate, a first electrode, a second electrode, and at least one organic functional layer which is arranged between first electrode and second electrode. The organic functional layer comprises a matrix material, a first compound and a second compound, the first compound interacting with the second compound, and the first compound and/or the second compound interacting with the matrix material. The interactions generate a conductivity in the organic functional layer that is improved relative to the conductivity of the matrix material alone.

The inventors have surprisingly determined that in the operation of an optoelectronic component, a combination of matrix material, first compound and second compound in at least one organic functional layer brings about increased conductivity in the organic functional layer. This results, furthermore, in an increased luminance and recombination efficiency, and so leads to an increased luminous efficiency of the optoelectronic component. The electromagnetic radiation generated by charge carrier recombination can in principle be outcoupled through the first or second electrode or through both.

Electromagnetic radiation here and below preferably comprises electromagnetic radiation having one or more wavelengths or wavelength ranges from an ultraviolet to infrared spectral range, the electromagnetic radiation more preferably being visible light having wavelengths or wavelength ranges from a visible spectral range between about 350 nm and about 800 nm.

In the context of this specification, the term "component" comprehends not only completed components such as, for example, organic light-emitting diodes (OLEDs) but also substrates and/or organic layer sequences. An assembly of an organic layer sequence with a first electrode and a second electrode may already constitute a component, for example, and may form a constituent of a superordinate second component, in which, for example, electrical connections are additionally present.

"Arranged between first electrode and second electrode" does not rule out the arrangement between the electrodes of further layers or elements, although the functional organic layer is always at least in indirect electrical and/or mechanical contact with one of the electrodes.

"Conductivity" here and below refers to the capacity of at least one substance to transport charge carriers—for example, negative charge carriers (electrons) and/or positive charge carriers (holes). The conductivity may be generated by interaction of at least two or three substances, as for example, by interaction of the first compound with the second compound, or of the first compound and/or of the second compound with the matrix material. The conductivity is dependent on the product of charge, charge carrier concentration and mobility of the charge carriers.

According to one embodiment, the conductivity of the organic functional layer is greater than a sum of a first conductivity, generated by sole interaction of the first compound with the matrix material, and of a second conductivity, generated by sole interaction of the second compound with the matrix material. The interaction of first and second compounds generates increased particle transport, holes, for example, in the organic functional layer, and an increased luminance and efficiency in the optoelectronic component.

"Sole interaction" in this context means that first compound and matrix material or second compound and matrix material interact exclusively with one another. More particularly "sole interaction" may mean that only first compound and matrix material or second compound and matrix material are conductive.

The interaction of the first compound with the second compound and/or of the first compound and/or of the second compound with the matrix material means in this context that between-molecule forces, intermolecular forces, intramolecular forces and/or chemical bonds are formed between the first compound and the second compound and/or between the first compound and/or second compound and the matrix material, examples being ionic interaction, hydrogen bonds, dipole interaction, Van der Waals interaction, ionic bonding, covalent bonding, coordinate bonding and/or metallic bonding.

In particular, at least one coordinate bond is formed by the first compound with the second compound and by the first compound with the matrix material and/or by the second compound with the matrix material.

"Coordinate bond" here and below indicates that between an electron donor and an electron acceptor a bond is formed, the electron donor providing all the electrons required for the formation of the coordinate bond, and the electron acceptor accepting the electrons provided. In particular, the electron donor and/or the electron acceptor may exchange electrons only partly or to a slight extent.

According to one embodiment, the first compound is an electron acceptor in relation to the matrix material and/or an electron acceptor in relation to the second compound.

According to a further embodiment, the second compound is an electron acceptor in relation to the matrix material and/or an electron donor in relation to the first compound.

According to another embodiment, the second compound in comparison to the first compound is more strongly electron-accepting relative to the matrix material.

According to one embodiment, in addition to first and second compounds, there may also be additional compounds—for example, one to three additional compounds—embedded in the matrix material, and being capable of interacting with the first compound, the second compound, the matrix material and/or one another, by forming coordinate bonds, for example. Alternatively or additionally the matrix material may be a mixture of two or more different matrix materials.

According to one embodiment, the optoelectronic component is an organic electronic component and is formed, for example, as an organic light-emitting diode (OLED). This OLED may have a first electrode on the substrate, for example. Applied over the first electrode there may be at least the organic functional layer, or a plurality of functional layers comprising organic materials. Applied over the organic functional layer or the plurality of functional layers is a second electrode.

The organic functional layer here may be selected from a group which comprises a layer that emits radiation, a hole transport layer, a hole injection layer, and a hole blocking layer. More particularly the organic functional layer is a hole transport layer and/or hole injection layer.

Any further organic functional layer may be selected from a group which comprises an electron injection layer, an electron transport layer, a hole blocking layer, or a layer which emits radiation. The layer which emits radiation may comprise a single layer or a plurality of sublayers, examples being layers or sublayers which emit in the green, red and/or blue spectral range of electromagnetic radiation. Alternatively or additionally it is possible for the electron injection layer, electron transport layer and hole blocking layer to feature an individual layer or a plurality of sublayers.

The layer which emits radiation may also have an active region which is suitable for giving off electromagnetic radiation in the operation of the organic electronic component.

According to one embodiment, the optoelectronic component may additionally have an encapsulation.

Alternatively, according to one further embodiment, the optoelectronic component is formed in the form of a transistor, a field effect transistor, for example, or a solar cell or a photodetector.

The substrate may comprise glass, quartz, polymeric films, metal, metal foils, silicon wafers, or another suitable substrate material. The OLED may also be designed as a "bottom emitter", meaning that the electromagnetic radiation generated in the active region is given off through the substrate. In that case the substrate has transparency for at least part of the electromagnetic radiation. Advantageously, the first electrode, which may be designed as anode, may be transparent and/or comprise a material which injects holes. The first electrode may have or consist of a transparent conductive oxide, for example. Transparent conductive oxides ("TCO", for short) are generally metal oxides, such as zinc oxide, tin oxide, cadmium oxide, titanium oxide, indium oxide or indium tin oxide (ITO), for example. The group of the TCOs includes not only binary metal-oxygen compounds, such as ZnO, $SnO_2$ or $In_2O_3$, for example, but also ternary metal-oxygen compounds, such as $Zn_2SnO_4$, $CdSnO_3$, $ZnSnO_3$, $MgIn_2O_4$, $GaInO_3$, $Zn_2In_2O_5$ or $In_4Sn_3O_{12}$, for example, or mixtures of different transparent conductive oxides. These TCOs do not necessarily conform to a stoichiometric composition, and may also be p- or n-doped.

The at least one organic functional layer may feature organic polymers, organic oligomers, organic monomers, organic small nonpolymeric molecules ("small molecules") or combinations thereof.

The second electrode may be designed as cathode and may therefore serve as a material which injects electrons. As cathode material, among others, in particular aluminum, barium, indium, silver, gold, magnesium, calcium or lithium, and also compounds, combinations and alloys thereof, may prove advantageous. Alternatively or additionally, the second electrode may also have one of the above-mentioned TCOs. Additionally or alternatively, the second electrode may also be of transparent design and/or the first electrode may be designed as cathode and the second electrode as anode. This means in particular that the OLED may also be designed as a "top emitter".

The first and/or the second electrode may each be of extensive format. Consequently, in the case of an OLED, it may be made possible for the electromagnetic radiation generated in the active region to be given off extensively. "Extensive" here may mean that the organic electronic component has an area of greater than or equal to several $mm^2$, preferably greater than or equal to one $cm^2$ and more preferably greater than or equal to one $dm^2$. Alternatively or additionally, the first and/or the second electrode(s) may be of structured format at least in partial regions. As a result, it may be made possible for the electromagnetic radiation generated in the active region to be given off in a structured way, in the form of pixels or pictograms, for instance.

In accordance with one embodiment, in the production of the functional layer by simultaneous vaporization of the first compound, the second compound and the matrix material from different sources, a third compound is generated by complexation of first and second compounds in the gas phase or in the layer. In particular, the first and second compounds are distributed homogeneously in the matrix material. Alternatively it is possible to establish a concentration gradient of first and second compounds in the matrix material. The third compound in particular forms an electron donor-electron acceptor complex. In addition, the third compound generates higher conductivity in the organic functional layer.

According to one embodiment, the first compound and/or the second compound is/are present in excess in the matrix material. By this means it is possible to exert process control as well over the conductivity of the organic functional layer, through the concentration of holes, for example.

According to a further embodiment, the matrix material is present in excess by comparison with the first and/or second compound(s), preferably, for example, in an excess of more than 75%, especially preferably in an excess of above 90%. The conductivity is proportional to the mobility of the charge carriers and to the number of charge carriers. On addition of a first compound and/or second compound to the matrix material, there is normally a fall in mobility. However, this is overcompensated by the generation of charge carriers, and so ultimately the conductivity rises by several orders of magnitude. The conductivity can therefore be controlled via the ratio of the matrix material to the first compound and/or second compound. Gradients horizontally and vertically are possible in terms of process technology.

The interaction of the first compound with the second compound leads to coordination of the two compounds with one another. The organic functional layer therefore comprises a third compound in the coordinated state, in other words involving formation of at least one coordinate bond of first and second compounds. In the organic functional layer there is a short-range order. Short-range order means that the entire layer per se is not crystalline, but that around the first compound, in its immediate vicinity, the second compound is arranged according to a particular pattern. The entire organic functional layer is therefore amorphous per se, and therefore does not have any long-range order.

According to one embodiment, the first compound comprises a metal complex having at least one central metal atom. The central metal atom of the first compound may be selected from an element of the Periodic System, as for example, from an element from transition group I, transition group VI and main group V of the Periodic System. The central metal atom is selected more particularly from a group which comprises Cu, Cr, Mo, and Bi.

Alternatively or additionally there may be at least two central metal atoms linked directly via a metal-metal bond and/or indirectly to one another. "Indirectly" in this context means that two metal atoms are bridged or linked to at least one semimetal atom and/or nonmetal atom, O, N, P, C, Si or B, for example, and no direct metal-metal bond is formed.

According to at least one embodiment, the first compound is a copper complex. Present in the copper complex there may be at least one copper cation in the II oxidation state.

According to at least one embodiment, the copper complex has at least one ligand which comprises an aryloxy group and an iminium group.

According to at least one embodiment, the aryloxy group and the iminium group of the ligand is a salicylaldiminate group. A salicylaldiminate group means a ligand which is formed from a salicylaldehyde and an aromatic monoamine or diamine or an olefinic monoamine or diamine. The ligand therefore comprises an amine-fused salicylaldehyde group and is capable of complexing between aryloxy group and the nitrogen of the iminium group, an azomethine group, for example.

According to at least one embodiment, the copper complex has one of the general formulae I or II:

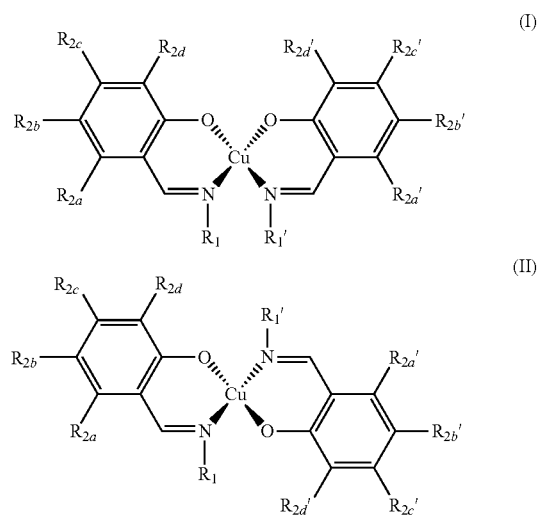

Formula (I) constitutes a cis isomer of the copper complex, formula (II) a trans isomer. A copper complex of this kind therefore comprises two ligands, coordinated or bonded with the copper cation.

Definitions in the formulae (I) and (II) are as follows: $R_1$, $R_{1'}$, $R_{2x}$ and $R_{2x'}$ (wherein x is in each case a, b, c or d) are selected independently of one another from a group which comprises unbranched, branched, fused, cyclic, unsubstituted and substituted alkyl radicals, substituted and unsubstituted aromatics, and substituted and unsubstituted heteroaromatics. Examples of such substituents are methyl groups, ethyl groups, decahydronaphthyl groups, cyclohexyl groups and alkyl radicals, which may be wholly or partly substituted and may have up to 20 carbon atoms. These alkyl radicals may further contain ether groups, such as ethoxy or methoxy groups, ester groups, amide groups, carbonate groups or else halogens, especially F.

Examples of substituted or unsubstituted aromatics are phenyl, biphenyl, naphthyl, phenanthryl or benzyl.

According to at least one embodiment, $R_1$ and $R_{1'}$, and $R_{2x}$ and $R_{2x'}$, are each identical.

According to at least one embodiment, $R_1$ and $R_{1'}$ are joined to one another.

According to at least one embodiment, at least one of $R_1$, $R_{1'}$, $R_{2x}$ and $R_{2x'}$ has an electron-withdrawing substituent.

According to one embodiment, the first compound comprises at least one ligand. The ligands are preferably coordinated and/or bonded to at least one central metal atom of the first compound. Ligands may be selected from a group as published in WO 2011/033023 A1 or US 2011/0089408 A1, or DE 102010013495 A1 or WO 2011/120,709 A1. An example of a suitable ligand is pentafluorobenzoate, fluorinated acetate or fluorinated acetylacetonate. A first compound may be, for example, fluorinated copper(I) acetate, fluorinated copper acetylacetonate or copper(II) trifluoromethanesulfonate.

The ligand of the first compound may be selected more particularly from the following group and combinations thereof:

fluorinated or nonfluorinated benzoic acids such as, for example, 2-(trifluoromethyl)benzoic acid; 3,5-difluorobenzoic acid; 3-hydroxy-2,4,6-triiodobenzoic acid; 3-fluoro-4-methylbenzoic acid; 3-(trifluoromethoxy)benzoic acid; 4-(trifluoromethoxy)benzoic acid; 4-chloro-2,5-difluorobenzoic acid; 2-chloro-4,5-difluorobenzoic acid; 2,4,5-trifluorobenzoic acid; 2-fluorobenzoic acid; 4-fluorobenzoic acid; 2,3,4-trifluorobenzoic acid; 2,3,5-trifluorobenzoic acid; 2,3-difluorobenzoic acid; 2,4-bis(trifluoromethyl)benzoic acid; 2,4-difluorobenzoic acid; 2,5-difluorobenzoic acid; 2,6-bis(trifluoromethyl)benzoic acid; 2,6-difluorobenzoic acid; 2-chloro-6-fluorobenzoic acid; 2-fluoro-4-(trifluoromethyl)benzoic acid; 2-fluoro-5-(trifluoromethyl)benzoic acid; 2-fluoro-6-(trifluoromethyl)benzoic acid; 3,4,5-trifluorobenzoic acid; 3,4-difluorobenzoic acid; 3,5-bis(trifluoromethyl)benzoic acid; 3-(trifluoromethyl)benzoic acid; 3-chloro-4-fluorobenzoic acid; 3-fluoro-5-(trifluoromethyl)benzoic acid; 3-fluorobenzoic acid; 4-fluoro-2-(trifluoromethyl)benzoic acid; 4-fluoro-3-(trifluoromethyl)benzoic acid; 5-fluoro-2-methylbenzoic acid; 2-(trifluoromethoxy)benzoic acid; 2,3,5-trichlorobenzoic acid; 4-(trifluoromethyl)benzoic acid; pentafluorobenzoic acid; 2,3,4,5-tetrafluorobenzoic acid;

fluorinated or nonfluorinated phenylacetic acid such as, for example, 2-fluorophenylacetic acid; 3-fluorophenylacetic acid; 4-fluorophenylacetic acid; 2,3-difluorophenylacetic acid; 2,4-difluorophenylacetic acid; 2,6-difluorophenylacetic acid; 3,4-difluorophenylacetic acid; 3,5-difluorophenylacetic acid; pentafluorophenylacetic acid; 2-chloro-6-fluorophenylacetic acid; 2-chloro-3,6-difluorophenylacetic acid; 3-chloro-2,6-difluorophenylacetic acid; 3-chloro-4-fluorophenylacetic acid; 5-chloro-2-fluorophenylacetic acid; 2,3,4-trifluorophenylacetic acid; 2,3,5-trifluorophenylacetic acid; 2,3,6-trifluorophenylacetic acid; 2,4,5-trifluorophenylacetic acid; 2,4,6-trifluorophenylacetic acid; 3,4,5-trifluorophenylacetic acid; 3-chloro-2-fluorophenylacetic acid; α-fluorophenylacetic acid; 4-chloro-2-fluorophenylacetic acid; 2-chloro-4-fluorophenylacetic acid; α,α-difluorophenylacetic acid; ethyl 2,2-difluoro-2-phenylacetate; and fluorinated or nonfluorinated acetic acid such as, for example, methyl trifluoroacetate; allyl trifluoroacetate; ethyl trifluoroacetate; isopropyl trifluoroacetate; 2,2,2-trifluoroethyl trifluoroacetate; difluoroacetic acid; trifluoroacetic acid; methyl chlorodifluoroacetate; ethyl bromodifluoroacetate; chlorodifluoroacetic acid; ethyl chlorofluoroacetate; ethyl difluoroacetate; (3-chlorophenyl)difluoroacetic acid; (3,5-difluorophenyl)difluoroacetic acid; (4-butylphenyl)difluoroacetic acid; (4-tert-butylphenyl)difluoroacetic acid; (3,4-dimethylphenyl)difluoroacetic acid; (3-chloro-4-fluorophenyl)difluoroacetic acid; (4-chlorophenyl)difluoroacetic acid; 2-biphenyl-3',5'-difluoroacetic acid; 3-biphenyl-3',5'-difluoroacetic acid; 4-biphenyl-3',5'-difluoroacetic acid; 2-biphenyl-3',4'-difluoroacetic acid; 3-biphenyl-3',4'-difluoroacetic acid; 4-biphenyl-3',4'-difluoroacetic acid; 2,2-difluoropropionic acid and/or higher homologs thereof. If the ligands L have acidic groups, the groups, in one preferred embodiment, may be in deprotonated form.

In at least one further embodiment, the ligand is selected from the group of unsubstituted, partially fluorinated or perfluorinated organic carboxylic acids. Organic carboxylic acids may generally be selected from the groups of aliphatically, saturated monocarboxylic acids; aliphatically, unsaturated monocarboxylic acids; aliphatically, saturated dicarboxylic acids; aliphatically, saturated tricarboxylic acids; aliphatically, unsaturated dicarboxylic acids; aromatic carboxylic acids; heterocyclic carboxylic acids; aliphatically, unsaturated, cyclic monocarboxylic acids. Particularly preferred partial or perfluorinated ligands L are selected from substituted or unsubstituted compounds of acetic acid, phenylacetic acid and/or benzoic acid and are given by way of example above. Particularly preferred is unfluorinated, partially fluorinated or perfluorinated acetic acid.

According to at least one embodiment, at least one of the ligands is arranged in bridging form between two metals.

In one embodiment, a first compound has Bi as central metal atom, but this atom is not coordinated with a bridging ligand.

According to one embodiment, the first compound, as for example, the central metal atom and/or the ligand of the first compound, comprises at least one coordination site.

According to one embodiment, the first compound, as for example, the central metal atom of the first compound, comprises at least one free coordination site, which is capable of accepting an electron pair of a second substance, as for example, the second compound, and forming a coordinate bond. This may also be referred to as Lewis acid-Lewis base interaction.

"Coordination site" here and below denotes at least one binding site. The coordination sites of the first compound may interact with the second compound and/or with the matrix material. Free coordination sites of the first compound may mean that there are empty orbitals of the central metal atom or of the central metal atoms, such as d-orbitals, p-orbitals or f-orbitals, for example, which are occupied in the course of interactions with electron pairs of the second compound and/or with the matrix material. As a result of the overlapping of the orbitals, an electron donor-electron acceptor complex may be generated, in which case holes (defect electrons) migrate. In the case of hole transport, an electron from a HOMO (Highest Occupied Molecular Orbital) fills a hole. The holes are transported via the matrix material, since there are percolation pathways here. The electron acceptor withdraws an electron entirely or partly from the matrix material and therefore generates a hole in the matrix material. This hole then migrates according to the process above. This increases the hole conductivity, the efficiency, and the lifetime of the optoelectronic component.

Additionally or alternatively, the coordination sites may be easily accessible and are not shielded by ligands.

According to one embodiment the first compound comprises a structural unit 1

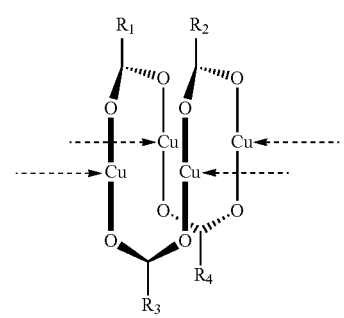

and/or a structural unit 2

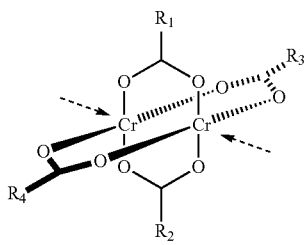

wherein Cu in the structural unit 1 does not necessarily mean only copper, Cu instead standing for a complexed metal which is selected from a group which comprises copper, chromium, molybdenum and bismuth, and combinations thereof, and Cr in the structural unit 2 does not necessarily mean only chromium, Cr instead standing for a complexed metal which is selected from a group which comprises copper, chromium, molybdenum and bismuth, and combinations thereof. In particular, Cr stands for a divalent bismuth.

$R_1$, $R_2$, $R_3$ and/or $R_4$ are identical or nonidentical and are each selected from a group which comprises substituted or unsubstituted hydrocarbon radicals, alkyl radicals, cycloalkyl radicals, heterocycloalkyl radicals, aryl radicals, heteroaryl radicals, and combinations thereof. The hydrocarbon radicals or alkyl radicals may be branched, linear or cyclic. The aryl and/or heteroaryl radicals may have one ring or a plurality of rings. The rings may be fused. A "ring" in this context means a cyclic association of atoms which are selected, for example, from a group comprising C, S, N, Si, O, P, and combinations thereof. "Fused" rings in this context means that a plurality of rings have at least one shared atom. Accordingly, even a spiro compound whose rings are joined only at one atom may be referred to as fused. In particular, at least two rings share two atoms with one another.

According to at least one embodiment, central metal atoms which comprise Cr and/or Mo form a dimeric first compound. Cu as central metal atom forms a tetrameric, hexameric, etc. first compound. In particular, trivalent Bi as central metal atom does not form a first compound according to structural unit 2.

In particular, 2 to 6 rings, more particularly 4 rings, are fused. Alternatively or additionally, the ring or the plurality of rings may have a conjugation. "Conjugation" in this context means that the ring or the plurality of rings has single and double bonds in alternation.

The arrows in the structural units 1 or 2 show possible coordination sites on the central metal atoms of the first compound.

The structural unit 1 has at least four free coordination sites. The structural unit 2 has at least two coordination sites.

Branched, linear or cyclic hydrocarbon radicals may comprise, in particular, 1-20 carbon atoms, examples being methyl, ethyl or fused rings, such as decahydronaphthyl or adamantyl, cyclohexyl, or wholly or partly substituted alkyl radicals. Alternatively or additionally, $R_1$, $R_2$, $R_3$ and/or $R_4$ may comprise substituted or unsubstituted aryl radicals, examples being phenyl, biphenyl, naphthyl, phenanthryl, benzyl, mesityl or heteroaryl radicals, examples being substituted or unsubstituted radicals selected from the following aromatic parent structures (scheme 1):

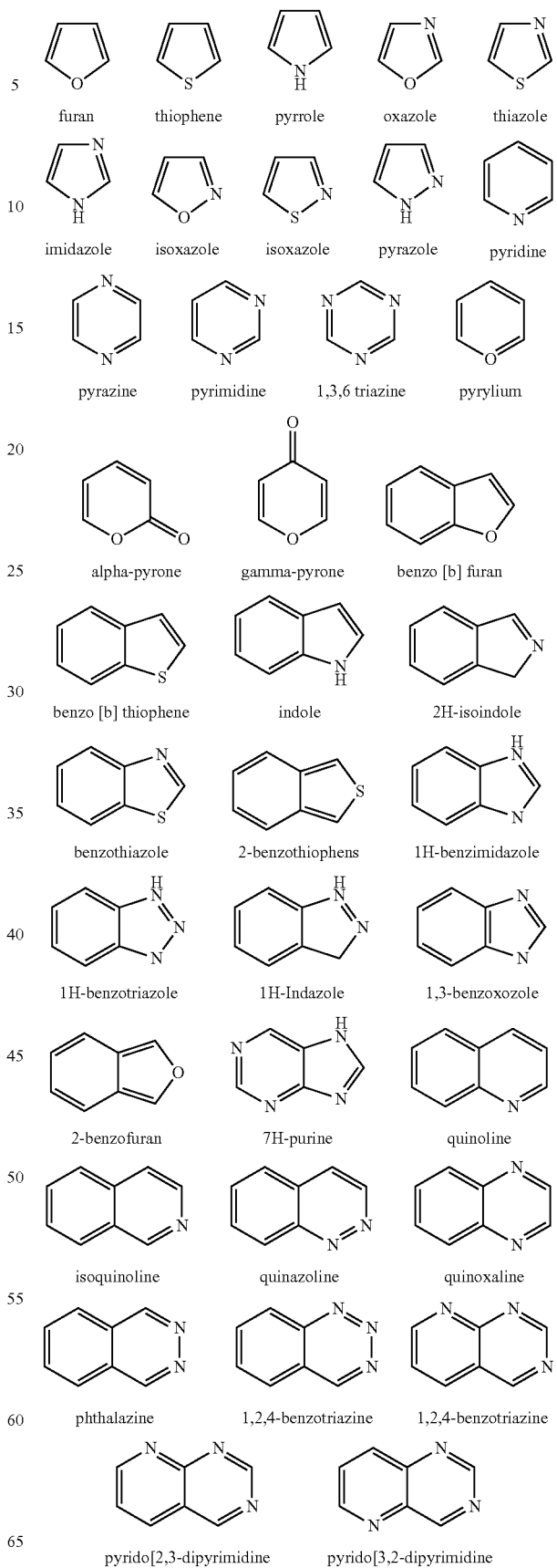

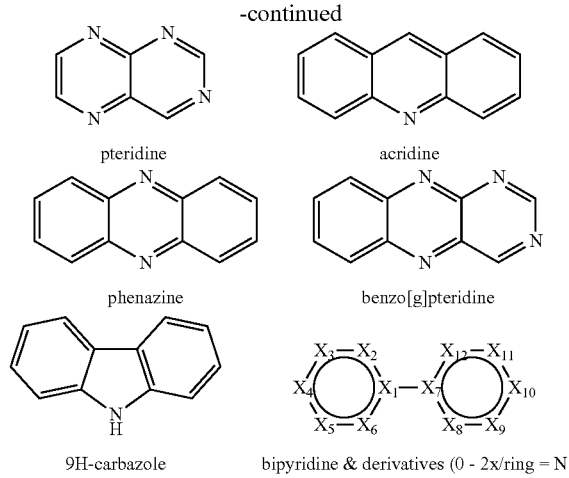

According to one embodiment, the first compound is tetrakis-Cu(I) perfluorobenzoate, referred to here and below by the abbreviated designation Cu(I)pFBz, or dichromium (II) tetrakistrifluoroacetate. In principle, however, further compounds known per se may also be used as first compound.

According to one embodiment, the first compound may be selected from a group which comprises copper(I) complexes as described, for example, in US 2011/0 089 408 A1, copper(II) complexes as described, for example, in US 2011/0 089 408 A1, copper(II) acetylacetonate as described, for example in DE 10 2010 013 495 A1, metal complexes, such as rhodium trifluoroacetate, for example, as described, for example, in DE 10 2007 028 237 A1 and DE 10 2007 028 238 A1.

The above-described embodiments of the first compound differ here in their electron acceptor strength in relation to the matrix material and relative to an identical concentration of the first compound in the matrix material. The first compound is in particular a copper(I) complex as described, for example, in US 2011/0 089 408 A1, and a rhodium complex, such as rhodium trifluoroacetate, for example, as described, for example, in DE 10 2007 028 237 A1 and DE 10 2007 028 238 A1. This confers a positive influence on the appearance of the optoelectronic component in the switched-off state.

According to one embodiment, the second compound comprises an aromatic and/or heteroaromatic which has at least two functional groups which are capable of forming a coordinate bond and/or of π-π interaction.

The π-π interaction may be developed in particular between aromatics with different acceptor strengths of first, second and/or the matrix material.

π-π interactions are forces which occur between π-systems of molecules, examples being π-systems of unsaturated compounds, and which come about as a result of their quadrupole moments.

The aromatics and/or heteroaromatics in particular have a ring or a plurality of rings. The aromatics and/or heteroaromatics may in particular comprise 2 to 6 rings, more particularly 4 rings. Alternatively or additionally, the ring or the plurality of rings is fused.

The functional groups are selected more particularly from a group which comprises amine, phosphine, phenol, thiol, cyano, isocyano, cyanato, nitrato, carboxylato, fluorinated carboxylato, acetylacetonate, fluorinated acetylacetonate, carbonyl, amide, imide, thienyl, fluoro, and combinations thereof.

The functional groups may also be electron donors.

According to one embodiment, the functional groups are capable of forming coordinate bonds which are developed to the first compound and/or to the matrix material.

According to one embodiment, the second compound has hole-conducting properties. The second compound may conduct holes or positive charges. As a result of this, the conductivity of the organic functional layer may be increased. This results in a lower voltage drop in the organic functional layer and hence in a higher efficiency of the optoelectronic component in comparison to an organic functional layer having a lower conductivity and a greater voltage drop, provided the charge carrier equilibrium remains constant. An additional effect of this is a higher exciton density in the layer which emits radiation, and hence a higher luminous efficiency of the optoelectronic component.

According to one embodiment, the second compound comprises at least one heteroaromatic which comprises at least one of the aromatic parent structures from scheme 1. In particular, the functional groups are linked to at least one aromatic parent structure from scheme 1.

The second compound may additionally have a conjugation; for example, the second compound has alternating single and double bonds.

According to one embodiment, the second compound comprises a structural unit 3

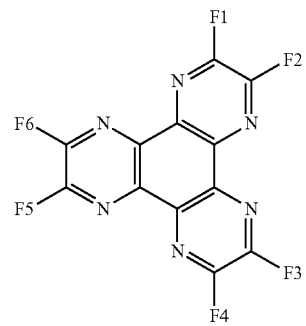

and/or a structural unit 4

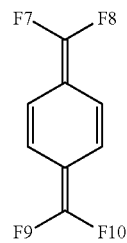

wherein F1, F2, F3, F4, F5, F6, F7, F8, F9 and/or F10 may be identical or nonidentical, are independent of one another, and are selected from a group which comprises amine, phosphine, phenol, thiol, cyano, isocyano, cyanato, nitrato, carboxylato, carbonyl, amide, imide, tienyl, fluoro, and combinations thereof. Cyanato is preferred in particular.

Alternatively or additionally, the structural units 3 or 4 may be substituted on the C atoms. Substituents may be selected from a group which comprises alkyl, aryl, heteroaryl, cycloalkyl, fluoro.

The second compound is selected more particularly from a group which comprises dipyrazino[2,3-f:2',3'-h]quinoxaline-2,3,6,7,10,11-hexacarbonitrile (used here with the abbreviated designation HAT-CN), 7,7,8,8-tetracyanoquinodimethane (used here with the abbreviated designation TCQ), 2,3,5,6-tetrafluoro-7,7,8,8-tetracyanoquinodimethane (used here with the abbreviated designation FCQ), 2,3-di(N-phthalimido)-5,6-dicyano-1,4-benzoquinone (used here with the abbreviated designation PBQ), pyrazino[2,3-f][1,10]phenanthroline-2,3-dicarbonitrile and the fluorinated or unfluorinated derivatives thereof, and tetracyanonaphthoquinodimethane and the fluorinated or unfluorinated derivatives thereof. The formulae of HAT-CN, TCQ, FCQ and PBQ are shown below. The arrows on the formulae show possible coordination sites which are capable of coordinating, for example, to the first compound and/or to the matrix material.

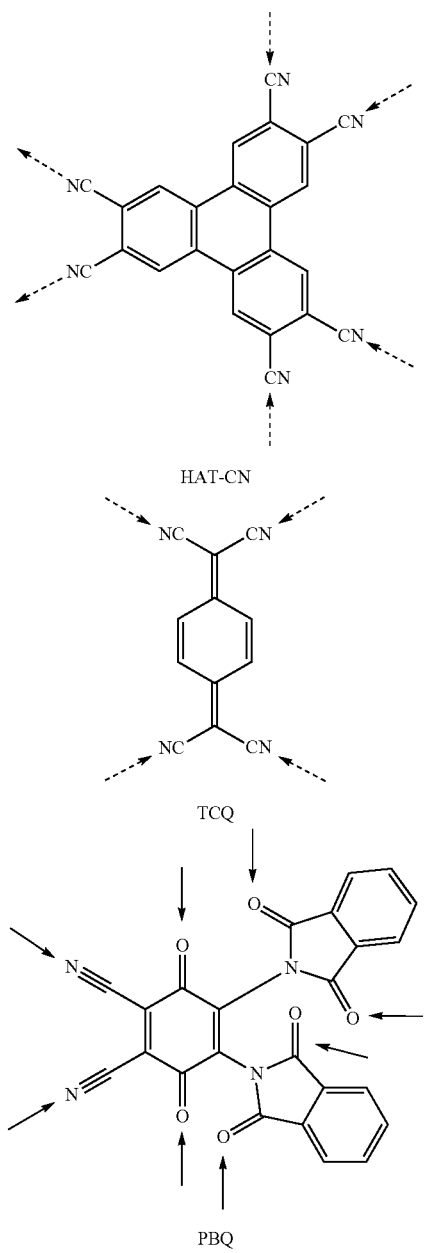

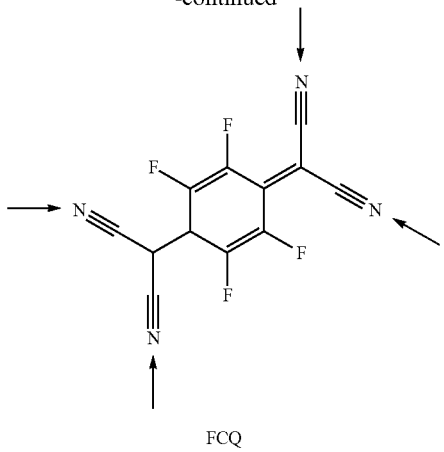

FCQ

According to one embodiment, the second compound has a π-electron system which comprises at least one ring, as for example, 1 to 6 rings. As a result, electrons of the first compound and/or second compound and/or holes may be localized in the matrix material. This results in a higher conductivity of the organic functional layer and therefore leads to a higher luminous efficiency of the optoelectronic component.

In one embodiment of the optoelectronic component, the metal complex of the first compound coordinates to one of the functional groups or to a plurality of the functional groups of the second compound. The coordination of the second compound to the central metal atom of the first compound may be via the functional groups of the second compound or via an atom, N, P, S or O for example, in the aromatic system of the second compound. During or after the coordination of the first compound to the second compound, there is preferably no elimination of the metal complex ligands treated beforehand, and therefore there is no ligand exchange.

According to one embodiment, the first compound forms a plurality of coordinate bonds with the second compound in such a way as to produce a chainlike structure and/or a netlike structure.

It is also possible for additional compounds to be incorporated into the matrix material, these compounds forming a chainlike and/or netlike structure—a three-dimensional structure, for example—by interaction with the first compound, the second compound and/or the matrix material.

According to one embodiment, the first compound, as well as having a "central metal atom" structural element M, has at least one "free coordination site" structural element $KS_n$ (index n here denotes the number of coordination sites). The second compound has an "aromatics and/or heteroaromatics" structural element A and at least one "functional group" structural element $FG_m$ (index m here denotes the number of functional groups). A "structural element" in this context refers to a characteristic region of the structural formula. For example, the "functional group" structural element $FG_n$ comprises all above-treated functional groups of the second compound. The "central metal atom" structural element M comprises the above-treated central metal atoms of the first compound. The "free coordination site" structural element $KS_n$ comprises the above-treated free coordination sites of the first compound. The "aromatics and/or heteroaromatics" structural element A comprises the above-treated aromatics and/or heteroaromatics of the second compound. At least one "free coordination site" structural element, for example, $KS_1$, is capable of interacting with the "functional group" structural element, for example, $FG_1$ of the second compound. This may be generated, for example, by formation of at least one coordinate bond. As a result it is possible for a chainlike structure and/or a netlike structure to form (see schematic diagram below).

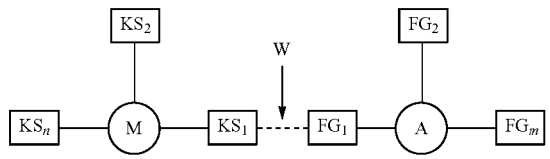

Here and in this context:
M: denotes a "central metal atom" structural element of the first compound
$KS_n$: denotes an "nth free coordination site" structural element of the first compound,
$KS_1$: denotes a "first free coordination site" structural element of the first compound,
$KS_2$: denotes a "second free coordination site" structural element of the first compound,
A: denotes an "aromatics and/or heteroaromatics" structural element of the second compound,
$FG_m$: denotes an "mth functional group" structural element of the second compound,
$FG_1$: denotes a "first functional group" structural element of the second compound,
$FG_2$: denotes a "second functional group" structural element of the second compound, and
W: denotes interactions between "first free coordination site" structural element of the first compound and "first functional group" structural element of the second compound.

According to one embodiment, the first compound and/or second compound may be used as a p-dopant. "p-Dopant" in this context means that the dopant is capable of receiving electrons of the matrix material and so generating holes in the matrix material.

According to one embodiment, the organic functional layer is a hole transport layer. The addition of a first compound to a second compound in a matrix material of the hole transport layer results in an improved hole transport capacity as compared with the matrix material which comprises no first and second compounds. This improved hole transport can be explained by the transfer of the holes or of the positive charge of the molecules of the matrix material that are able to interact with the first or second compound.

The following are shown below by way of example:
scheme 2: interaction of the first compound, exemplified by Cu(I)pFBz, with the second compound, exemplified by HAT-CN;
scheme 3: interaction of the first compound, exemplified by Cu(I)pFBz, with the second compound, exemplified by HAT-CN, and interaction of the first compound, exemplified by Cu(I)pFBz, with the matrix material, exemplified by N,N'-bis(naphthalen-1-yl)-N,N'-bis(phenyl)benzidene (NPD); and
scheme 4: interaction of the first compound, exemplified by Cu(I)pFBz, with the second compound, exemplified by HAT-CN, and interaction of the second compound, exemplified by HAT-CN, with the matrix material, exemplified by NPD. The interactions are not limited to the interactions shown in schemes 1 to 4 or other interactions of compounds described in the working examples. Instead, another working example of the first compound, second compound and/or matrix material may also be utilized. In addition it is possible for first compound, second compound and/or matrix material to interact via at least one π-π interaction between two aromatics with different acceptor strengths, as is shown, for example, in DE 10 2007 028 238 A1 and/or in Sevryugina et al., Inorg. Chem. 2007, 46, 7870-7879.

Scheme 2

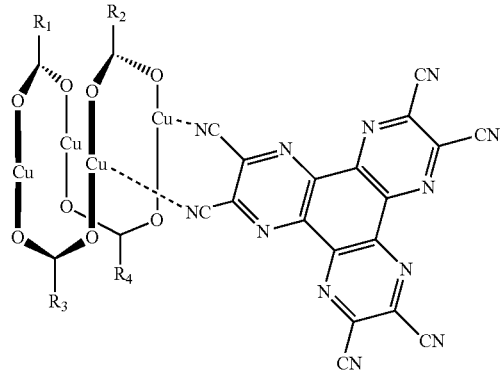

Scheme 3

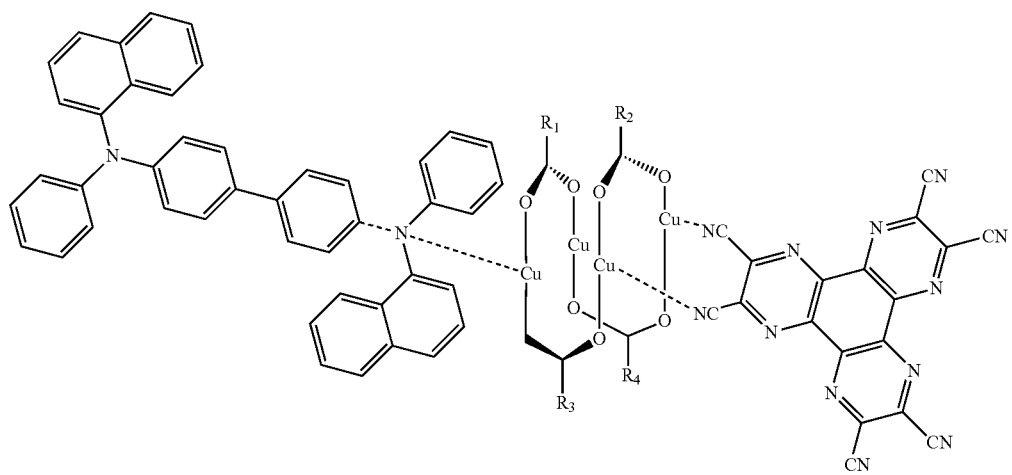

Scheme 4

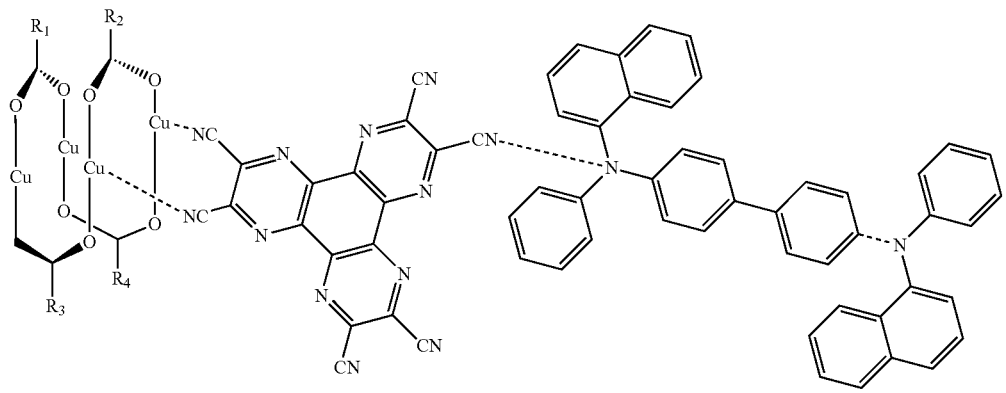

According to one embodiment, not all molecules of the matrix material interact with the molecules of the first compound and/or second compound.

The matrix material, the hole transport layer, for example, may be selected from a group which comprises one or more compounds of the following groups: NPB (N,N'-bis(naphthalen-1-yl)-N,N'-bis(phenyl)benzidine, β-NPB (N,N'-bis(naphthalen-2-yl)-N,N'-bis(phenyl)benzidine), TPD (N,N'-bis(3-methylphenyl)-N,N'-bis(phenyl)benzidine), N,N'-bis(naphthalen-1-yl)-N,N'-bis(phenyl)-2,2-dimethylbenzidine, spiro-TPD (N,N'-bis(3-methylphenyl)-N,N'-bis(phenyl)-9,9-spirobifluorene), spiro-NPB (N,N'-bis(naphthalen-1-yl)-N,N'-bis(phenyl)-9,9-spirobifluorene), DMFL-TPD (N,N'-bis(3-methylphenyl)-N,N'-bis(phenyl)-9,9-dimethylfluorene, DMFL-NPB (N,N'-bis(naphthalen-1-yl)-N,N'-bis(phenyl)-9,9-dimethylfluorene), DPFL-TPD (N,N'-bis(3-methylphenyl)-N,N'-bis(phenyl)-9,9-diphenylfluorene), DPFL-NPB (N,N'-bis(naphth-1-yl)-N,N'-bis(phenyl)-9,9-diphenylfluorene), Sp-TAD (2,2',7,7'-tetrakis(n,n-diphenylamino)-9,9'-spirobifluorene), TAPC (di[4-(N,N-ditolylamino)phenyl]cyclohexane), spiro-TTB (2,2',7,7'-tetra(N,N-ditolyl)aminospirobifluorene), BPAPF (9,9-bis[4-(N,N-bisphenyl-4-yl-amino)phenyl]-9H-fluorene), spiro-2NPB (2,2',7,7'-tetrakis[N-naphthyl(phenyl)amino]-9,9-spirobifluorene), spiro-5 (2,7-bis[N,N-bis(9,9-spirobifluoren-2-yl)amino]-9,9-spirobifluorene), 2,2'-spiro-DBP (2,2'-bis[N,N-bis(biphenyl-4-yl)amino]-9,9-spirobifluorene), PAPB (N,N'-bis(phenanthren-9-yl)-N,N'-bis(phenyl)benzidine), TNB (N,N,N',N'-tetranaphthalen-2-yl-benzidine), spiro-BPA (2,2'-bis(N,N-diphenylamino)-9,9-spirobifluorene), NPAPF (9,9-bis[4-(N,N-bisnaphth-2-yl-amino)phenyl]-9H-fluorene), NPBAPF (9,9-bis[4-(N,N'-bisnaphth-2-yl-N,N'-bisphenylamino)phenyl]-9H-fluorene), TiOPC (titanium oxide phthalocyanine), CuPC (copper phthalocyanine), F4-TCNQ (2,3,5,6-tetrafluoro-7,7,8,8-tetracyanoquinodimethane), m-MTDATA (4,4',4''-tris(N-3-methylphenyl-N-phenylamino)triphenylamine), 2T-NATA (4,4',4''-tris(N-(naphthalen-2-yl)-N-phenylamino)triphenylamine), 1T-NATA (4,4',4''-tris(N-(naphthalen-1-yl)-N-phenylamino)triphenylamine), NATA (4,4',4''-tris(N,N-diphenylamino)triphenylamine), PPDN (pyrazino[2,3-f][1,10]phenanthroline-2,3-dicarbonitrile), MeO-TPD (N,N,N',N'-tetrakis(4-methoxy-phenyl)benzidine), MeO-spiro-TPD (2,7-bis[N,N-bis(4-methoxyphenyl)amino]-9,9-spirobifluorene), 2,2'-MeO-spiro-TPD (2,2'-bis[N,N-bis(4-methoxyphenyl)amino]-9,9-spirobifluorene), β-NPP (N,N'-di(naphthalen-2-yl)-N,N'-diphenylbenzene-1,4-diamine), NTNPB (N,N'-diphenyl-N,N'-di-[4-(N,N-ditolylamino)phenyl]benzidine and NPNPB (N,N'-diphenyl-N,N'-di-[4-(N,N-diphenylamino)phenyl]benzidine). The listing is by no means limited, however. Any matrix material which commonly transports holes is suitable as a constituent of the organic functional layer.

According to one embodiment, the fraction of the matrix material in the organic functional layer is more than 50%, preferably more than 80%, and more preferably more than 90%, as for example, 95%.

In a further embodiment, the organic functional layer is an electron-blocking layer.

Further specified is an organic functional layer which comprises a matrix material, a first compound, and a second compound, the first compound forming an electron donor-electron acceptor complex with the second compound via at least one coordinate bond, and the first compound and/or the second compound interacting, as electron acceptor, with the matrix material, and the interaction in the electron donor-electron acceptor complex generating conductivity in the organic functional layer.

For the organic functional layer, the matrix material, the first compound and/or the second compound, the definitions and observations which apply are the same as those specified above in the description for an optoelectronic component.

According to one embodiment, the conductivity of the organic functional layer is greater than a sum of a first conductivity, generated by sole interaction of the first compound with the matrix material, and of a second conductivity, generated by sole interaction of the second compound with the matrix material.

According to one embodiment, the organic functional layer is a constituent of an organic light-emitting diode, of a transistor, a field effect transistor, for example, of a solar cell or of a photodetector.

Further specified is a method for producing an optoelectronic component, the method comprising the following steps:
A) providing a substrate,
B) applying a first electrode,
C) depositing at least one organic functional layer or a plurality of organic functional layers on the substrate,
D) applying a second electrode,
the depositing of the organic functional layer taking place by simultaneous vaporization from different sources of a first compound, of a second compound, and of a matrix material.

The deposition of the organic functional layer by simultaneous vaporization from different sources of a first compound, of a second compound, and of a matrix material causes a higher conductivity on the part of the organic functional layer. Particularly when using an organic functional layer having a thickness of 5 nm to 600 nm, preferably 100 to 400 nm, to reduce the susceptibility to an electrical short-circuit in the optoelectronic component, in extensive OLEDs, for example, the vertical voltage drop across the organic functional layer can be reduced further, thereby boosting efficiency, including luminous efficiency, of the optoelectronic component. Additionally, the lateral current distribution of the optoelectronic component can be improved if the conductivity of the organic functional layer is in the order of magnitude of conductivity of the first electrode and/or second electrode, such as of indium tin oxide, i.e., tin oxide-doped indium oxide (no), for example.

Alternatively or additionally, in method step D, at least the first and second compounds may be mixed prior to vaporization, with the depositing of the organic functional layer taking place by simultaneous vaporization from a source of the first and second compounds and from another source of the matrix material.

For the method for producing an optoelectronic component, the definitions and observations which apply are the same as those specified above in the description for an optoelectronic component.

According to one embodiment, the number of coordinate bonds between the first organic compound and the second organic compound and/or between the first organic compound and the matrix material and/or between the second organic compound and the matrix material may be controlled by concentration change during vaporization.

FIG. 1 shows a schematic side view of an optoelectronic component, using the working example of an organic light-emitting diode (OLED). The OLED comprises a substrate 1, which is located right at the bottom and may be, for example, transparent and may be made of glass. Arranged on the substrate 1 is a first electrode 2, which may be formed as a layer, and may be, for example, a transparent conductive oxide such as, for example, zinc oxide, tin oxide, cadmium oxide, titanium oxide, indium oxide or indium tin oxide (ITO). Located above this electrode layer 2 is a hole injection layer 3, arranged above which in turn is the hole transport layer 4. Located thereon is a layer which emits radiation and which may have, for example, a plurality of individual layers. On the layer 5 which emits radiation there is the hole-blocking layer 6, on which the electron transport layer 7 and, lastly, the electron injection layer 8, with adjacent second electrode 9, may be arranged. The second electrode 9 may be, for example, a metal electrode or a further transparent electrode, made from one of the aforementioned transparent conductive oxides, for example. The organic functional layer of the invention is, for example, the hole injection layer, hole transport layer, hole blocking layer, or layer which emits radiation.

If a voltage is applied between the first electrode 2 and the second electrode 9, current flows through the optoelectronic component. In that case, one electrode, the cathode, injects electrons into the electron injection layer 8, and the other electrode, the anode, injects what are called holes. In the layer 5 which emits radiation, the holes and electrons recombine, forming electron-hole pairs, known as excitons, which are capable of emitting electromagnetic radiation.

Alternatively, an optoelectronic component (not shown here) is formed as an OLED with substrate 1, first electrode 2, organic functional layer and second electrode 9.

An alternative possibility is an arrangement of an optoelectronic component (not shown here) in the form of an OLED composed of substrate 1, first electrode 2, hole injection layer 3, electron transport layer 5, and second electrode 9.

Alternatively or additionally, the first and second compounds in the matrix material are formed as a film or as a casting, and are arranged or applied to or over the first electrode (not shown here).

Alternatively it is possible to form the hole injection layer 3, the hole transport layer 4 or the layer 5 which emits radiation as an organic functional layer, with the organic functional layer comprising the first compound and second compound in a matrix material.

The organic functional layer in accordance with the present invention here may be any layer in which holes are transported. The organic functional layer in accordance with the invention preferably comprises the hole injection layer 3 or hole transport layer 4. The organic functional layer may also, however, be the layer 5 which emits radiation, for example, in such a way, for example, that a further material, emitting radiation, is vaporized with the first compound and with the second compound. Alternatively, however, the material which emits radiation may also be incorporated otherwise into the layer 5 which emits radiation. As a result of the improved hole transport capacity, a greater number of holes and electrons are able to recombine, thus forming more excitons (electron-hole pairs). This results in an increase in the exciton density in the layer 5 which emits radiation, thereby increasing the luminance and efficiency of the optoelectronic component.

Here and below, the following abbreviated designations are used for comparative examples of first compound or second compound in the matrix material:

V1: comparative example of a first compound Cu(I)pFBz in the matrix material HTM-014 by Merck V8: comparative example of a second compound HAT-CN in the matrix material HTM-014, and A1: working example of a first compound Cu(I)pFBz with a solid fraction of 5% and a second compound HAT-CN with a variable fraction in the matrix material HTM-014.

Figure 2:
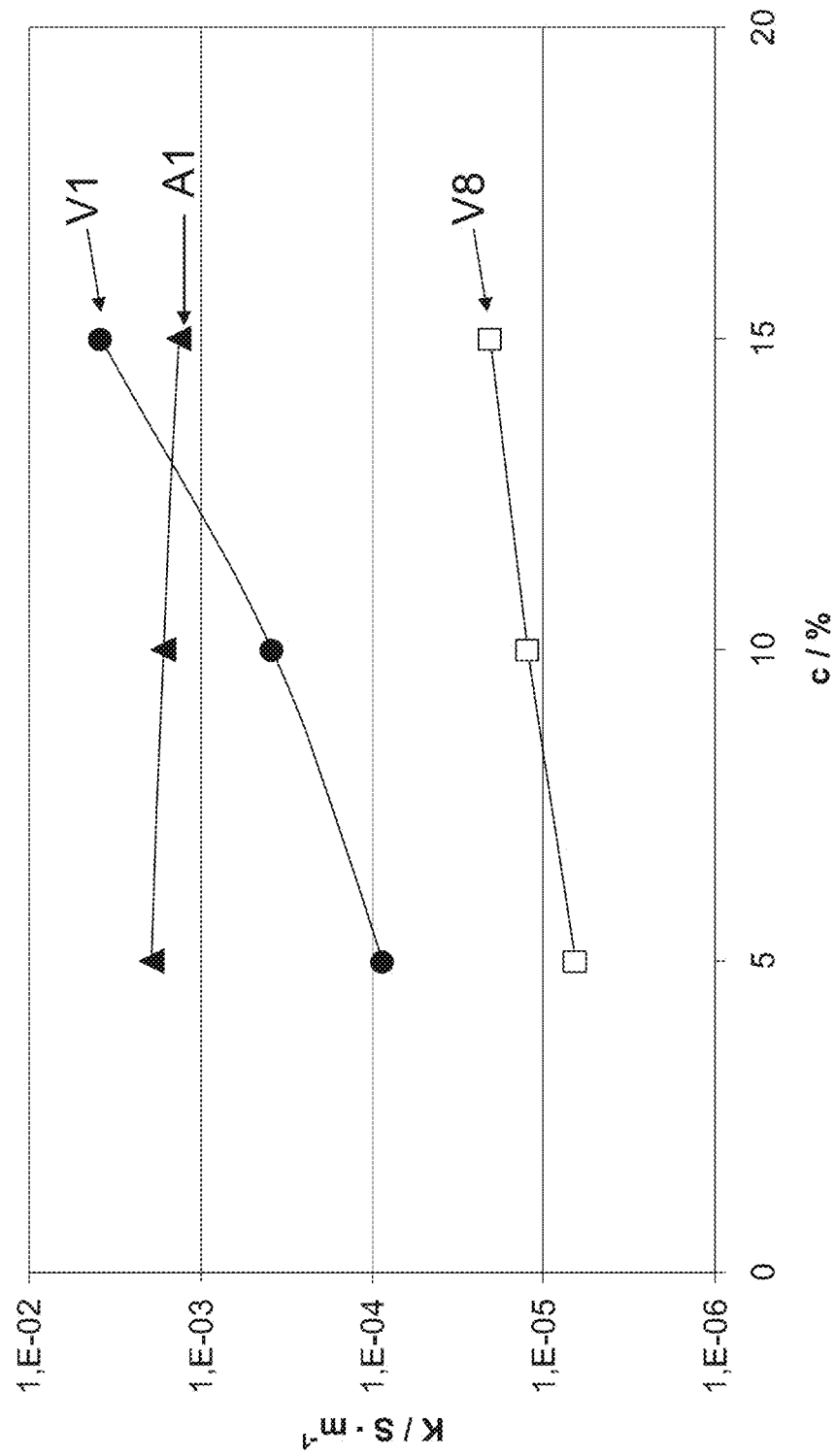
FIG. 2 shows the concentration dependence of the specific conductivity K of comparative examples and according to an inventive embodiment.
Figure 3:
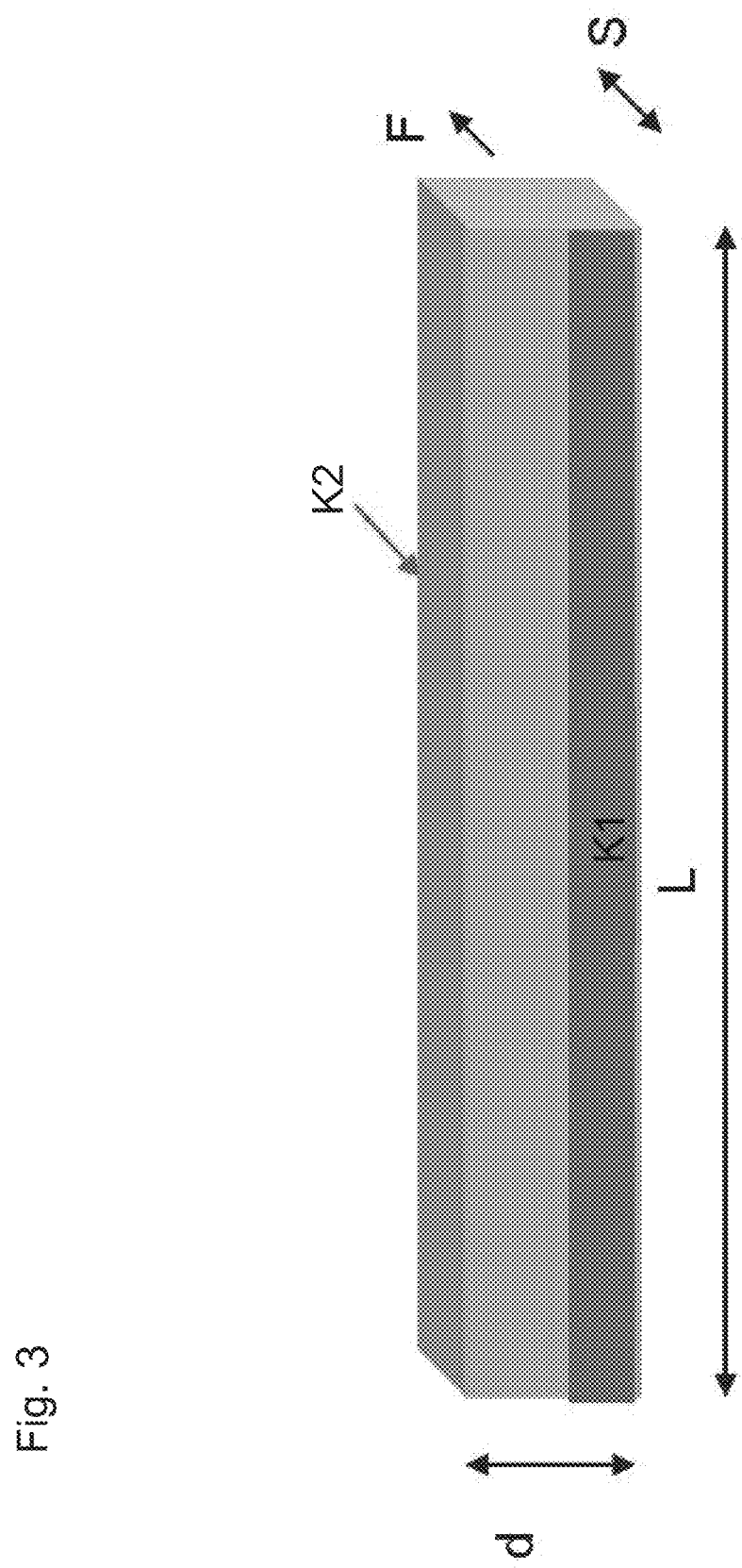
FIG. 3 shows the measuring geometry of an organic test structure.

FIG. 2 shows the specific conductivity K in siemens per meter (S×m$^{-1}$) of comparative examples V1 and V8, and also of working example A1, as a function of the concentration c, expressed as a volume percentage, of the first compound Cu(I)pFBz or of the second compound HAT-CN. In this case, an organic test structure was used for the conductivity measurement in accordance with FIG. 3. In FIG. 3, d denotes thickness of the organic test structure, L length of the organic test structure, S width of the organic test structure, K1 first contact, and K2 second contact. Applied between the contacts K1 and K2 is a voltage, thereby forming a homogeneous electrical field F in the semiconductor. The specific conductivity K then results according to the following equation:

$$K = \frac{j}{F} = \frac{j \cdot S}{U} = \frac{I \cdot S}{U \cdot L \cdot d}$$

wherein j is current density and U is voltage.

By simultaneous thermal vaporization from different sources, the respective matrix material, the first compound and the second compound were deposited, as an organic functional layer with an overall thickness of 120 nm, on an ITO (indium tin oxide=tin oxide-doped indium oxide) electrode. The specific conductivity K was calculated from the current-voltage characteristic curve, and has been represented graphically in FIG. 2 and FIG. 4.

The matrix material exhibits a relatively poor specific conductivity, K, of less than $10^{-6}$ S×m$^{-1}$ (not shown here). By vaporization of the first compound or second compound in the matrix material, however, it is possible to achieve a specific conductivity K of significantly greater than $10^{-6}$ S×m$^{-1}$. The first compound Cu(I)pFBz in the matrix material HTM-014 (V1) generates a higher specific conductivity K than the second compound HAT-CN in the matrix material HTM-014 (V8). For an identical concentration, the specific conductivity K for comparative example V1, for Cu(I)pFBz in HTM-014, is higher by two orders of magnitude in comparison to V8, comprising HAT-CN in HTM-014. With increasing concentration of the first compound Cu(I)pFBz or second compound HAT-CN, an increase is observed in the specific conductivity K. This results from interactions of the first compound Cu(I)pFBz or second compound HAT-CN with the respective matrix material. As a result, a high hole mobility and charge transfer are made possible, and the luminous efficiency of the optoelectronic component is improved.

Here and below, the following abbreviated designations are used for working examples and comparative examples of first compound and/or second compound in the matrix material:

V9: comparative example of a second compound HAT-CN with a fraction of 10% in the matrix material HTM-014, V10: comparative example of a first compound Cu(I)pFBz with a fraction of 5% in the matrix material HTM-014, A1: working example of a first compound Cu(I)pFBz with a fraction of 5% and of a second compound HAT-CN with a fraction of 10% in the matrix material HTM-014, and V11: comparative example of a first compound Cu(I)pFBz with a fraction of 5% in the matrix material HTM-014. "Fraction" in this context denotes the volume percent of the first compound or of the second compound relative to the matrix material.

Figure 4:
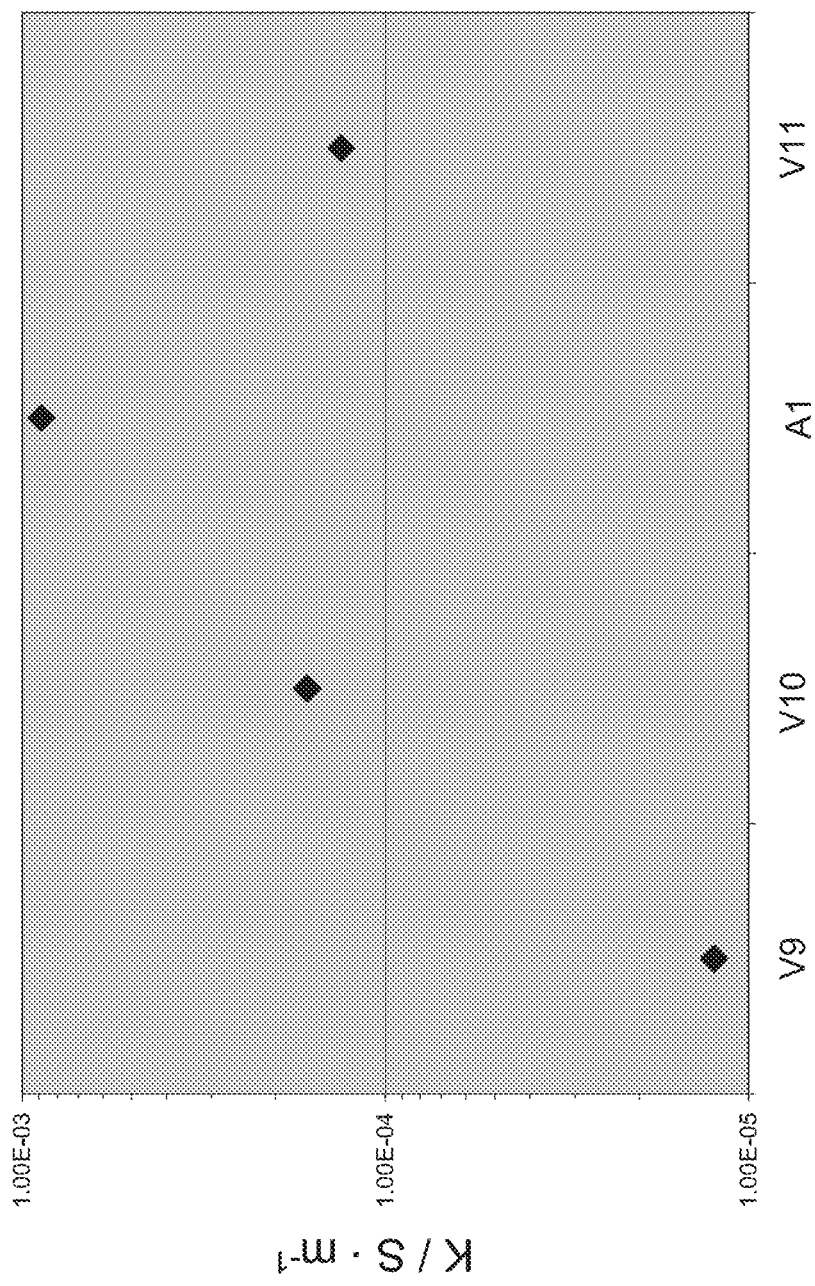
FIG. 4 shows the specific conductivity K by interaction of a first compound and a second compound, according to a further embodiment, in comparison to comparative examples.

FIG. 4 shows the specific conductivity K in siemens per meter (S×m$^{-1}$) of V9, V10, A1 and V11. The specific conductivity K of V9 is in the order of magnitude of $10^{-5}$ S/m, whereas the specific conductivity K of V10 and V11 is higher by one order of magnitude (K=$10^{-4}$ S/m). Surprisingly, the specific conductivity K of A1 is increased further by almost one order of magnitude (approximately $10^{-3}$ S/m). The specific conductivity K of the organic functional layer is increased significantly by the addition of the first compound and of the second compound in the matrix material, in contrast to the specific conductivity K, which is generated by sole interaction of the first compound with the matrix material (V10 or V11), and to the specific conductivity K which is generated by sole interaction of the second compound with the matrix material (V9). The specific conductivity K of A1 comes about through an advantageous network of the first compound Cu(I)pFBz and of the second compound HAT-CN in the matrix material HTM-014. In the case of the vaporization of Cu(I)pFBz and HAT-CN, there is no cross-contamination of materials in the sources. This is shown in FIG. 4 by the virtually identical specific conductivities K of V10 and V11, which were produced before and after A1, respectively.

Synthesis of copper(I) pentafluorobenzoate

Cu$_2$O (0.451 g, 3.15 mmol) is admixed with 2 ml of (CF$_3$CO)$_2$O, followed by 30 ml of benzene. The mixture is heated under reflux overnight, giving a blue solution and a little unreacted starting material. This suspension is filtered using Celiter, in order to remove Cu$_2$O. The blue solution is then evaporated to dryness, giving a very pale blue solid. The desired product is obtained by operating under reduced pressure at 60° C. to 70° C. for ten to 15 hours. The yield is 64%. The crystalline material can be obtained by sublimation of the crude solid at 110° C. to 120° C.

The reaction product (0.797 g, 1.1 mmol) is kept with pentafluorinated benzoic acid (0.945 g, 6.76 mmol) in a Schlenk flask in a glovebox, with 55 ml of benzene being added to the mixture. A homogeneous light-blue solution is heated under reflux overnight and then evaporated to dryness, giving a pale blue solid. Operation takes place under reduced pressure at 90° C. to 100° C. for several days, in order to remove the excess of unreacted benzoic acid. A colorless solid stable in air is obtained by sublimation deposition of the crude powder at 220° C. after a week. The yield of copper(I) pentafluorobenzoate is 65%.

Production of the Organic Functional Layer

The first compound (for example, Cu(I)pFBz), second compound (for example, HAT-CN) and the matrix material (for example, HMT-014), each in different sources, are heated thermally to their respective sublimation points, and these compounds are vaporized simultaneously. In this operation, the first compound, the second compound and the matrix material are applied as an organic functional layer to a first electrode, ITO, for example.

Production of an Optoelectronic Component

The organic functional layer produced can be deposited on a provided substrate, glass, for example, on which a first electrode has been applied, with a second electrode being applied thereto.

The invention is not restricted by the description using the working examples or specified combinations of features. Instead, the invention also encompasses individual new features as such and also any combination of specified features, including in particular any combination of features in the claims, even if that feature or that combination is not itself explicitly indicated in the claims or working examples.

The invention claimed is:

1. An optoelectronic component comprising:
    a substrate;
    a first electrode;
    a second electrode; and
    an organic functional layer arranged between the first electrode and the second electrode, the organic functional layer comprising a matrix material, a first compound, and a second compound,
    wherein the first compound interacts with the second compound,
    wherein the first compound and/or the second compound interacts with the matrix material,
    wherein the interactions generate conductivity in the organic functional layer,
    wherein at least one coordinate bond is formed by the first compound with the second compound and at least one coordinate bond is formed by the first compound with the matrix material, or at least one coordinate bond is formed by the first compound with the second compound and at least one coordinate bond is formed by the second compound with the matrix material,
    wherein the first compound comprises a compound selected from the group consisting of the following structural units or formula:

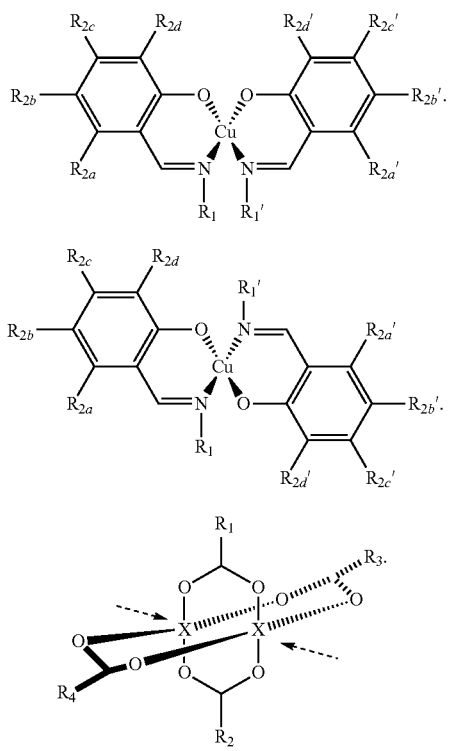

wherein, in formulae I and II, $R_1$, $R_{1'}$, $R_{2a}$, $R_{2a'}$, $R_{2b}$, $R_{2b'}$, $R_{2c}$, $R_{2c'}$, $R_{2d}$, and $R_{2d'}$, independently of one another and each is selected from the group consisting of unbranched unsubstituted and substituted alkyl radicals, branched unsubstituted and substituted alkyl radicals, fused unsubstituted and substituted alkyl radicals, cyclic unsubstituted and substituted alkyl radicals, substituted and unsubstituted aromatics, and substituted and unsubstituted heteroaromatics, wherein, in formulae III, $R_1$, $R_2$, $R_3$ and $R_4$ are identical or unidentical and each is selected from the group consisting of substituted or unsubstituted alkyl radicals, substituted or unsubstituted cycloalkyl radicals, substituted or unsubstituted heterocycloalkyl radicals, substituted or unsubstituted aryl radicals, substituted or unsubstituted heteroaryl radicals, and combinations thereof, wherein, in formulae III, X is chromium, molybdenum, bismuth or Cu and Cr, and wherein the second compound comprises a compound selected from the group consisting of dipyrazino[2,3-f:2',3'-h]quinoxaline-2,3,6,7,10,11-hexacarbonitrile, 7,7,8,8-tetracyanoquinodimethane, 2,3-di(N-phthalimido)-5,6-dicyano-1,4-benzoquinone, pyrazino[2,3-f][1,10]phenanthroline-2,3-dicarbonitrile and fluorinated or unfluorinated derivatives thereof, and tetracyanonaphthoquinodimethane and fluorinated or unfluorinated derivatives thereof.

2. The optoelectronic component according to claim 1, wherein the organic functional layer comprises a layer selected from the group consisting of a hole transport layer, a hole injection layer, and a hole blocking layer.

3. The optoelectronic component according to claim 1, wherein the conductivity of the organic functional layer is greater than a sum of a first conductivity, generated by sole interaction of the first compound with the matrix material, and of a second conductivity, generated by sole interaction of the second compound with the matrix material.

4. The optoelectronic component according to claim 1, wherein the first compound comprises an electron acceptor in relation to the matrix material and/or an electron acceptor in relation to the second compound.

5. The optoelectronic component according to claim 1, wherein the second compound comprises an electron acceptor in relation to the matrix material and/or an electron donor in relation to the first compound.

6. The optoelectronic component according to claim 1, wherein a third compound is generated by complexing of first and second compounds in a gas phase, the third compound produced by simultaneous vaporization from different sources of the first compound, of the second compound and of the matrix material.

7. The optoelectronic component according to claim 1, wherein the second compound comprises an aromatic and/or heteroaromatic that has at least two functional groups that are capable of forming a coordinate bond and/or of π-π interaction.

8. The optoelectronic component according to claim 7, wherein the functional groups comprises functional groups selected from the group consisting of amine, phosphine, phenol, thiol, cyano, isocyano, cyanato, nitrato, carboxylato, fluorinated carboxylato, acetylacetonate, fluorinated acetylacetonate, carbonal, amide, imide, thienyl, fluoro, and combinations thereof.

9. The optoelectronic component according to claim 1, wherein the first compound forms at least one coordinate bond with the second compound, to give a chainlike structure and/or a netlike structure.

10. The optoelectronic component according to claim 1, wherein at least one coordinate bond is formed by the first compound with the second compound and at least one coordinate bond is formed by the first compound with the matrix material.

11. The optoelectronic component according to claim 1, wherein at least one coordinate bond is formed by the first compound with the second compound and at least one coordinate bond is formed by the second compound with the matrix material.

12. An organic functional layer comprising:
a matrix material;
a first compound; and
a second compound,
wherein at least one coordinate bond is formed by the first compound with the second compound and at least one coordinate bond is formed by the first compound with the matrix material or wherein at least one coordinate bond is formed by the first compound with the second compound and at least one coordinate bond is formed by the second compound with the matrix material,
wherein the first compound forms an electron donor-electron acceptor complex with the second compound via at least one coordinate bond,
wherein the first compound and/or the second compound, as electron acceptor or as electron acceptors, interact with the matrix material,
wherein the interactions and the electron donor-electron acceptor complex generate conductivity in the organic functional layer,
wherein the first compound comprises a compound selected from the group consisting of the following structural units or formula:

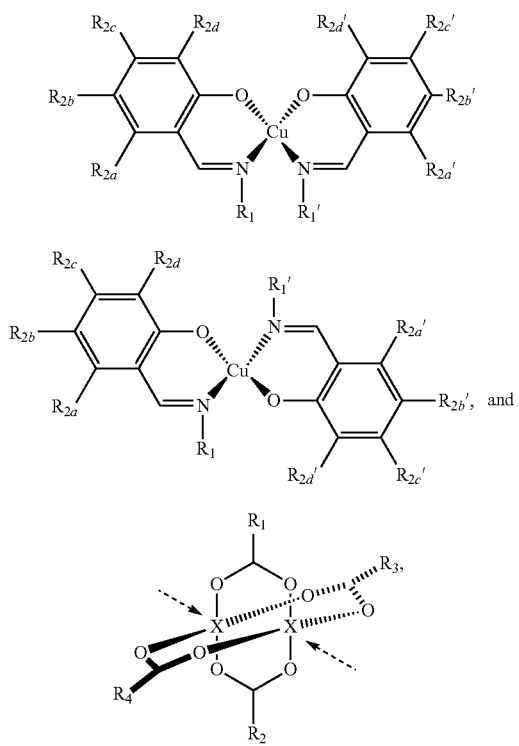

wherein, in formulae I and II, $R_1$, $R_{1'}$, $R_{2a}$, $R_{2a'}$, $R_{2b}$, $R_{2b'}$, $R_{2c}$, $R_{2c'}$, $R_{2d}$ and $R_{2d'}$ independently of one another and each is selected from the group consisting of unbranched unsubstituted and substituted alkyl radicals, branched unsubstituted and substituted alkyl radicals, fused unsubstituted and substituted alkyl radicals, cyclic unsubstituted and substituted alkyl radicals, substituted and unsubstituted aromatics, and substituted and unsubstituted heteroaromatics, wherein, in formulae III, $R_1$, $R_2$, $R_3$ and $R_4$ are identical or unidentical and each is selected from the group consisting of substituted or unsubstituted alkyl radicals, substituted or unsubstituted cycloalkyl radicals, substituted or unsubstituted heterocycloalkyl radicals, substituted or unsubstituted aryl radicals, substituted or unsubstituted heteroaryl radicals, and combinations thereof, wherein, in formulae III, X is chromium, molybdenum, bismuth or Cu and Cr, and wherein the second compound comprises a compound selected from the group consisting of dipyrazino[2,3f:2',3'-h]quinoxaline-2,3,6,7,10,11-hexacarbonitrile, 7,7,8,8-tetracyanoquiono-dimethane, 2,3-di(N-phthalimido)-5,6-dicyano-1,4-benzoquinone, pyrazino[2,3-f][1,10]phen-anthroline-2,3-dicarbonitrile and fluorinated or unfluorinated derivatives thereof, and tetracyanonaphthoquinodimethane and fluorinated or unfluorinated derivatives thereof.

13. The organic functional layer according to claim 12, wherein the conductivity of the organic functional layer is greater than a sum of a first conductivity, generated by sole interaction of the first compound with the matrix material, and of a second conductivity, generated by sole interaction of the second compound with the matrix material.

14. An optoelectronic component comprising:
a substrate;
a first electrode;
a second electrode; and
an organic functional layer arranged between the first electrode and the second electrode, the organic functional layer comprising a matrix material, a first compound, and a second compound,
wherein the first compound interacts with the second compound,
wherein the first compound and/or the second compound interacts with the matrix material,
wherein the interactions generate conductivity in the organic functional layer,
wherein at least one coordinate bond is formed by the first compound with the second compound and at least one coordinate bond is formed by the first compound with the matrix material, or at least one coordinate bond is formed by the first compound with the second compound and at least one coordinate bond is formed by the second compound with the matrix material,
wherein the first compound comprises a compound selected from the group consisting of the following structural units or formula:

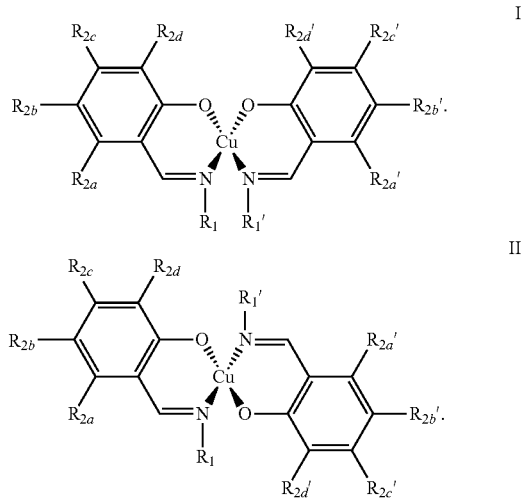

wherein, in formulae I and II, $R_1$, $R_{1'}$, $R_{2a}$, $R_{2a'}$, $R_{2b}$, $R_{2b'}$, $R_{2c}$, $R_{2c'}$, $R_{2d}$, and $R_{2d'}$, independently of one another and each is selected from the group consisting of unbranched unsubstituted and substituted alkyl radicals, branched unsubstituted and substituted alkyl radicals, fused unsubstituted and substituted alkyl radicals, cyclic unsubstituted and substituted alkyl radicals, substituted and unsubstituted aromatics, and substituted and unsubstituted heteroaromatics,
wherein the second compound comprises a compound selected from the group consisting of dipyrazino[2,3-f:2',3'-h]quinoxaline-2,3,6,7,10,11-hexacarbonitrile, 2,3-di(N-phthalimido)-5,6-dicyano-1,4-benzoquinone, and fluorinated or unfluorinated derivatives thereof, and tetracyanonaphthoquinodimethane and fluorinated or unfluorinated derivatives thereof.

* * * * *

UNITED STATES PATENT AND TRADEMARK OFFICE
CERTIFICATE OF CORRECTION

PATENT NO. : 11,038,127 B2  
APPLICATION NO. : 14/895486  
DATED : June 15, 2021  
INVENTOR(S) : Jaeger et al.

Page 1 of 2

It is certified that error appears in the above-identified patent and that said Letters Patent is hereby corrected as shown below:

In the Specification

In Column 13, Lines 20-67, and Column 14, Lines 1-19, delete the formulas and insert:

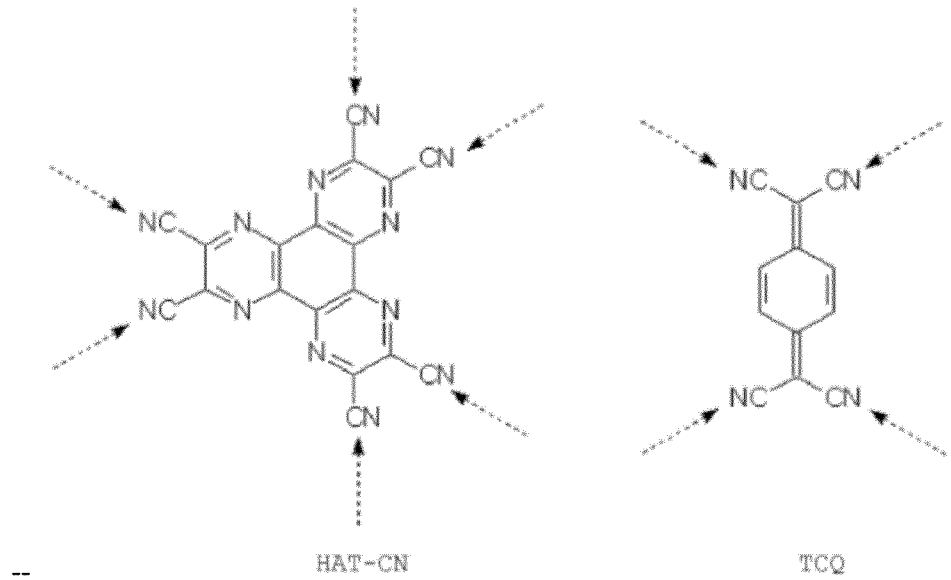

--

Signed and Sealed this  
Fifth Day of October, 2021

Drew Hirshfeld  
*Performing the Functions and Duties of the*  
*Under Secretary of Commerce for Intellectual Property and*  
*Director of the United States Patent and Trademark Office*

CERTIFICATE OF CORRECTION (continued)
U.S. Pat. No. 11,038,127 B2

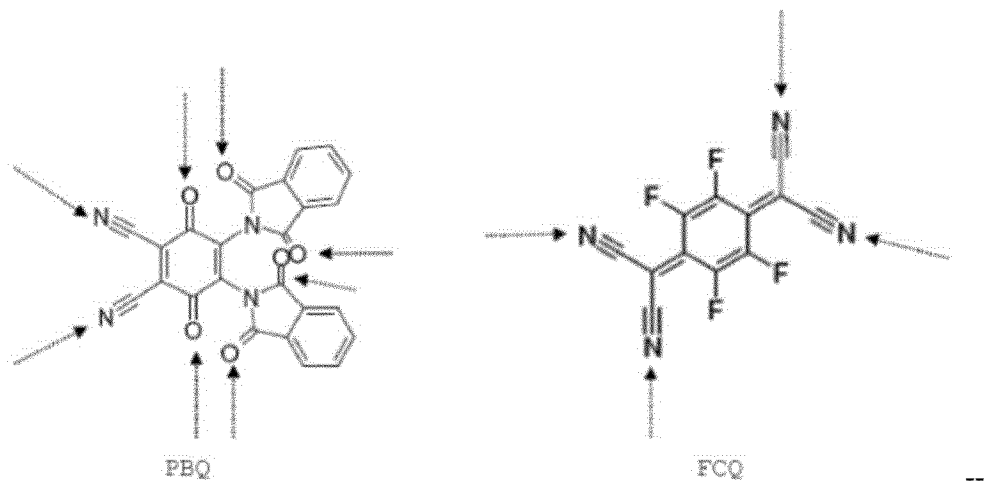

--.

In the Claims

In Column 25, Lines 20-30, Claim 12, delete the formula and insert:

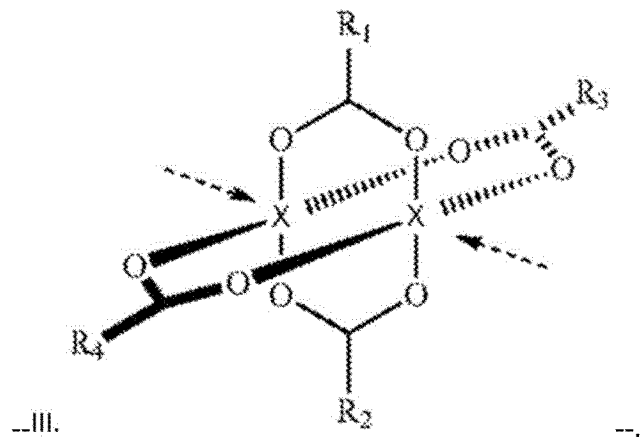

--III.   --.